(12) United States Patent
Caletka et al.

(10) Patent No.: US 6,410,988 B1
(45) Date of Patent: Jun. 25, 2002

(54) THERMALLY ENHANCED AND MECHANICALLY BALANCED FLIP CHIP PACKAGE AND METHOD OF FORMING

(75) Inventors: David V. Caletka, Apalachin, NY (US); Jean Dery; Eric Duchesne, both of Granby (CA); Michael A. Gaynes, Vestal, NY (US); Eric A. Johnson, Greene, NY (US); Luis J. Matienzo, Endicott, NY (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/570,895

(22) Filed: May 15, 2000

Related U.S. Application Data

(60) Division of application No. 09/080,117, filed on May 15, 1998, which is a continuation-in-part of application No. 08/842,417, filed on Apr. 24, 1997, now Pat. No. 5,883,430.

(51) Int. Cl.[7] .............................................. H01L 23/48
(52) U.S. Cl. ...................................... 257/778; 257/796
(58) Field of Search ................................. 361/705, 704; 29/830; 437/209; 438/108; 257/706, 720, 778, 783, 796

(56) References Cited

U.S. PATENT DOCUMENTS

| | | | | |
|---|---|---|---|---|
| 5,396,403 A | * | 3/1995 | Patel | 361/705 |
| 5,450,283 A | * | 9/1995 | Lin et al. | 361/704 |
| 5,490,324 A | * | 2/1996 | Newman | 29/830 |
| 5,672,548 A | * | 9/1997 | Culnane et al. | 437/209 |
| 5,891,753 A | * | 4/1999 | Akram | 438/108 |

* cited by examiner

Primary Examiner—David Nelms
(74) Attorney, Agent, or Firm—William N. Hogg

(57) ABSTRACT

A method of making a flip chip package that maintains flatness over a wide temperature range and provides good heat dissipation is described. A laminate substrate is electrically connected to electrical contacts disposed on a chip and underfill material is applied between the soldered connections. A body, for example an uncured dielectric material, is applied to the chip, the laminate substrate, a thermally conductive member or combinations thereof, and thermally conductive member is disposed adjacent to the surface of the chip that is opposite the surface connected to the laminate substrate. The body is extruded between the chip and the thermally conductive member. The thickness of the thermally conductive member is determined by balancing the stiffness and the CTE of both the thermally conductive member and the laminate substrate, and the length and width of the thermally conductive member may vary but are at least the size of the corresponding length and width of the chip.

18 Claims, 3 Drawing Sheets

THERMALLY ENHANCED AND
MECHANICALLY BALANCED FLIP CHIP
PACKAGE AND METHOD OF FORMING

RELATED APPLICATIONS

This application is a divisional of application Ser. No. 09/080,117, filed May 15, 1998, which is a continuation-in-part of application Ser. No. 08/842,417, filed on Apr. 24, 1997, now U.S. Pat. No. 5,883,430, entitled "Thermally Enhanced Flip Chip Package and Method of Forming".

BACKGROUND OF THE INVENTION

1. Field of the Invention

This invention relates generally to an encapsulated flip chip package and a method for making the same. More particularly, this invention relates to a flip chip package having a thermally conductive member that maintains flatness and provides good heat dissipation.

2. Description of Related Art

The general construction of a plastic encapsulated semiconductor device, also known as a plastic ball grid array (PBGA) package, is a semi-conductor chip mounted on an upper surface of a laminate substrate with a plurality of solder balls attached to a lower surface of the laminate substrate that can be bonded to a circuit card. Traditionally, the most common PBGA package has been a semi-conductor chip that is electrically connected to electrical circuitry on the laminate substrate by conventional wire bonds or loop wire bonds. The semi-conductor device has an over-molded plastic resin body that protects the semi-conductor chip and the wire bonds, and this over-molded dielectric may be up to about 20 mils thick above the surface of the chip in order to adequately protect the wire loops. Consequently, the wire-bonded PBGA has a relatively high thermal resistance, and the low heat dissipation makes the wire-bonded package unsuitable for high power applications.

Flip-chip PBGAs have been subsequently introduced and, if encapsulated, are made thinner than wire-bonded PBGAs for better heat dissipation. Flip chip packages generally consist of semi-conductor chips that have terminations in the form of solder pads or bump contacts that are disposed on the surface of the chip that is adjacent to the laminate substrate. Flip-chip packages derive their name from the apparent flipping of the chip to yield a chip orientation that is upside down compared to that of the wire-bonded PBGAs. Since the solder bumps are connected to the circuitry of the laminate substrate, there is no need for large wire loops or the thick application of dielectric that surrounds them.

A flip-chip package, however, typically requires an underfill material to keep moisture away from solder interconnections and to reinforce the solder joints which are prone to fatigue. The underfill material encompasses the solder interconnections between the chip and the laminate substrate. In addition to the underfill, the flip chip package may have a body that surrounds the chip. If the body surrounds only the periphery of the chip then it does not add significant thermal resistance to the package because the surface of the chip, opposite the surface that is electrically connected to the laminate substrate, is often left exposed. Such a structure, and flip chip packages without a body, are known as "bare-chip". While the bare-chip structure has enhanced thermal dissipation, dimensional stability is very difficult to control and warpage is a severe problem. The coefficient of thermal expansion (CTE) of the chip, for example a silicon chip, is about 3 ppm/° C. whereas the CTE of a composite laminate substrate is about 20 ppm/° C. During thermal cycling the chip restricts the expansion or contraction of the laminate substrate. The bending that is produced by thermal mismatch results in early fatigue failure of the ball grid array when the flip-chip package is attached to a circuit card or board. In severe cases the bending can cause fracture of the chip.

Flip-chip packages have also been made with a thermally-conductive covering, usually metal, to further improve heat transfer. The thermally-conductive covering is attached to the chip with a thermal coupler such as an adhesive, a thermal paste or a grease to improve the transfer of heat from the chip to the thermally conductive covering. A flip-chip package of this construction can have an additional problem since attachment of the thermally-conductive covering may result in delamination at the chip-to-covering interface. If the thermal coupler is substantially rigid the thermal coupler can fracture the chip, or if the thermal coupler is a non-rigid thermal grease, for example, it is prone to displacement during thermal cycling.

It is desirable to produce the flip-chip package that has low thermal resistance yet eliminates the need for a thermal coupler. It also desirable to produce a flip chip package that exhibits minimal warpage throughout the temperature range encountered in manufacture and in use to enhance ball grid array fatigue life.

SUMMARY OF THE INVENTION

The invention herein provides for a flip-chip package and a method of making a flip chip package that includes a thermally conductive member to dissipate heat while maintaining package flatness over a wide range of temperatures, and preferably from about minus 50° C. to about 150° C. The method of forming a flip-chip package comprises providing a laminate substrate having electrical circuitry disposed within; mounting a chip onto the laminate substrate and electrically connecting the electrical contacts on first or active surface of the chip to the circuitry of the laminate substrate; applying an underfill disposed between the chip and the laminate substrate; providing a thermally conductive member disposed adjacent to the surface of the chip that is opposite the first surface that contacts the underfill; and, applying a body to encapsulate the chip, wherein the body contacts the thermally conductive member, the chip and the laminate substrate as well as to any exposed portion of the underfill.

The body is preferably comprised of a material that, when cured, becomes sufficiently rigid to transmit force to the chip to counteract the force applied to the chip by the substrate. It is also preferred that the modulus and the CTE of the body are sufficient to put the periphery of the chip into compression in the direction normal to the first surface. The body, preferably an uncured dielectric material, is applied to the chip or to the substrate or to the thermally conductive member or combinations thereof. As the thermally conductive member and the chip are brought into contact with one another, the body is thereby extruded along the surface of the chip that is opposite the first surface and around the periphery of the chip, and thus encapsulates the chip.

The size of the thermally conductive member is selected according to the invention herein to prevent warpage and delamination of the overall flip chip package. The thermally conductive member is chosen such that the combination of its stiffness and its coefficient of thermal expansion (CTE) approximately balances the stiffness and CTE of the laminate substrate. Formulas for determining the size of the thermally conductive member are described herein. First, the thickness of the thermally conductive member is selected to approximately balance the stiffness and the CTE with the stiffness and CTE of the laminate substrate. Second, the length and width of the thermally conductive member may be varied considerably provided that these dimensions are at least as large and preferably at least three characteristic lengths larger than the corresponding width and length of the chip, where the "characteristic length" is defined herein as the height of the chip.

DETAILED DESCRIPTION OF THE INVENTION

Figure 1:
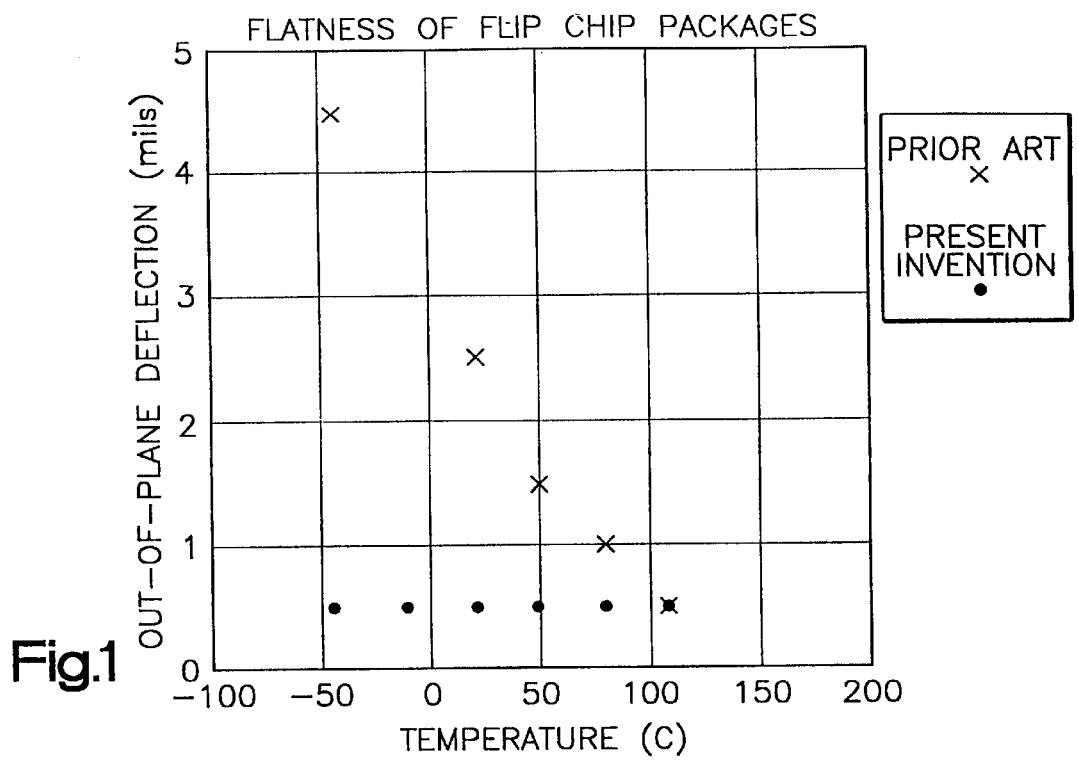
FIG. 1 is a graph that shows flip chip Package warpage as a function of environmental temperature. The graph compares the effect of temperature on the warpage of a flip chip package that comprises a thermally conductive member of the present invention to a flip chip package of the prior art.

The invention herein provides for a flip chip package that has low thermal resistance yet undergoes minimum deflection when subjected to thermal cycling. FIG. 1 is a graph that shows the flip chip package's warpage as a function of environmental temperature, and specifically, it compares the effect of temperature on the warpage of a flip chip package of the invention herein and a flip chip package of the prior art. In the temperature range from about −50° C. to about 160° C., a flip chip package of the prior art, having no thermally conductive member, has a deflection up to about 4.5 mils at the low end of the temperature range, as shown in FIG. 1. By contrast the flip chip package of the invention herein undergoes minimum deflection, preferably less than about 1 mil and more preferably less than about 0.5 mil, throughout the same temperature range. The graph of data shows that both flip chip packages are nearly stress free and thus exhibit minimal, if any, deflection at about 140° C. to about 160° C., which is near the cure temperature of the body. As the temperature is lowered to about minus 50° C., the flip chip package of the present invention undergoes a maximum deflection of about 0.5 mil.

Figure 2:
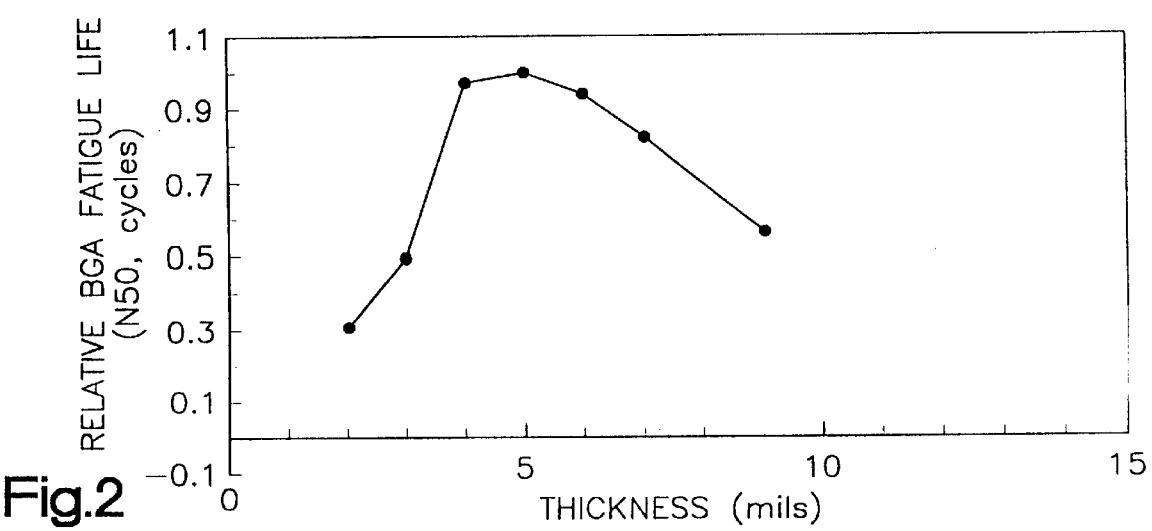
FIG. 2 is a graph that shows the fatigue life of a flip chip package as a function of the thickness of the thermally conductive member as calculated by finite element analysis.

FIG. 2 illustrates BGA fatigue of a flip chip package as a function of the thickness of the thermally conductive member. The graph shows the number of thermal cycles to failure, wherein $N_{50}$ represents 50% sample failure. Fatigue failure is determined when any solder joint in the BGA fails. The data show that flip chip packages of the invention herein have much reduced fatigue where the thickness of the thermally conductive member falls within the specific range determined herein. FIG. 2 shows the fatigue of a flip chip package comprising a thermally conductive member that is 301 stainless steel having CTE of about 17.0 ppm/° C. and modulus of about 193 GPa, and a laminate substrate that is an epoxy glass composite having a CTE of about 17.0 ppm/° C. and a modulus of about 20 GPa.

Figure 3:
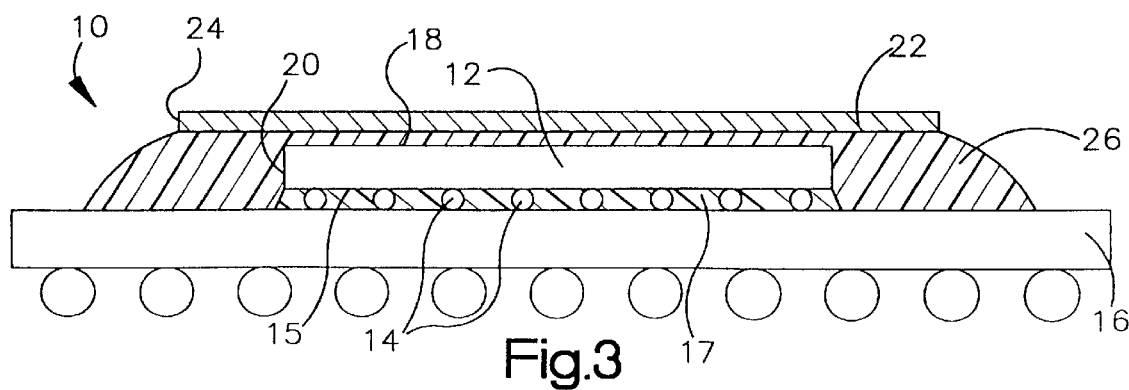
FIG. 3 is a schematic sectional view of a flip chip package of the present invention, showing the width of a conductive member as being greater than the width of the flip chip and less than the width of the laminate substrate.

A flip chip package 10 embodying the present invention is shown schematically in FIG. 3. Flip chip package 10 comprises chip 12 having a plurality of electrical contacts (not shown) on first or active surface 15 that are electrically connected, for example by soldered joints 14, to corresponding contacts associated with one or more electrical circuits disposed in laminate substrate 16. Underfill material 17 partially or fully fills the volume between chip 12 and laminate substrate 16. Flip chip package 10 also comprises thermally conductive member 22 disposed adjacent to surface of chip 12 that is opposite first surface of the chip. Body 26 is disposed between chip 12 and thermally conductive member 22. Body 26 surrounds chip 12 and contacts at least a portion of laminate substrate 16 and thermally conductive member 22.

A method of forming flip chip package 10 comprises providing chip 12 and laminate substrate 16 and attaching electrical contacts of chip 12 on active surface 15 to circuitry of laminate substrate 16 preferably by a heating cycle to form solder interconnections. Chip 12 is comprised of materials well known in the art. An exemplary list of materials includes silicon, germanium and gallium arsenide. Laminate substrate 16 is typically a laminated circuit board having a number of electrical circuits defined within and is adapted for interconnection with other components of an electronic assembly. Laminate substrate 16 is comprised of materials well known in the art, for example, polyimide, polytetrafluoroethylene and liquid crystal polymer. A suitable material, for example, is an epoxy glass composite commercially available as DriClad® from IBM Corporation. Preferably, underfill material 17 is applied between the connected contacts of chip 12 and laminate substrate 16. The underfill material is typically an electrically non-conductive coupling material, for example, a filled epoxy. A suitable filled epoxy is commercially available as HYSOL® 4511 from Dexter Corporation. Underfill material 17 acts as a buffer for stresses that arise due to the differences between the CTE of the chip and the laminate substrate, and it also serves to protect the soldered connections from moisture. The underfill material may extend past periphery 20 of chip 12.

Figure 4:
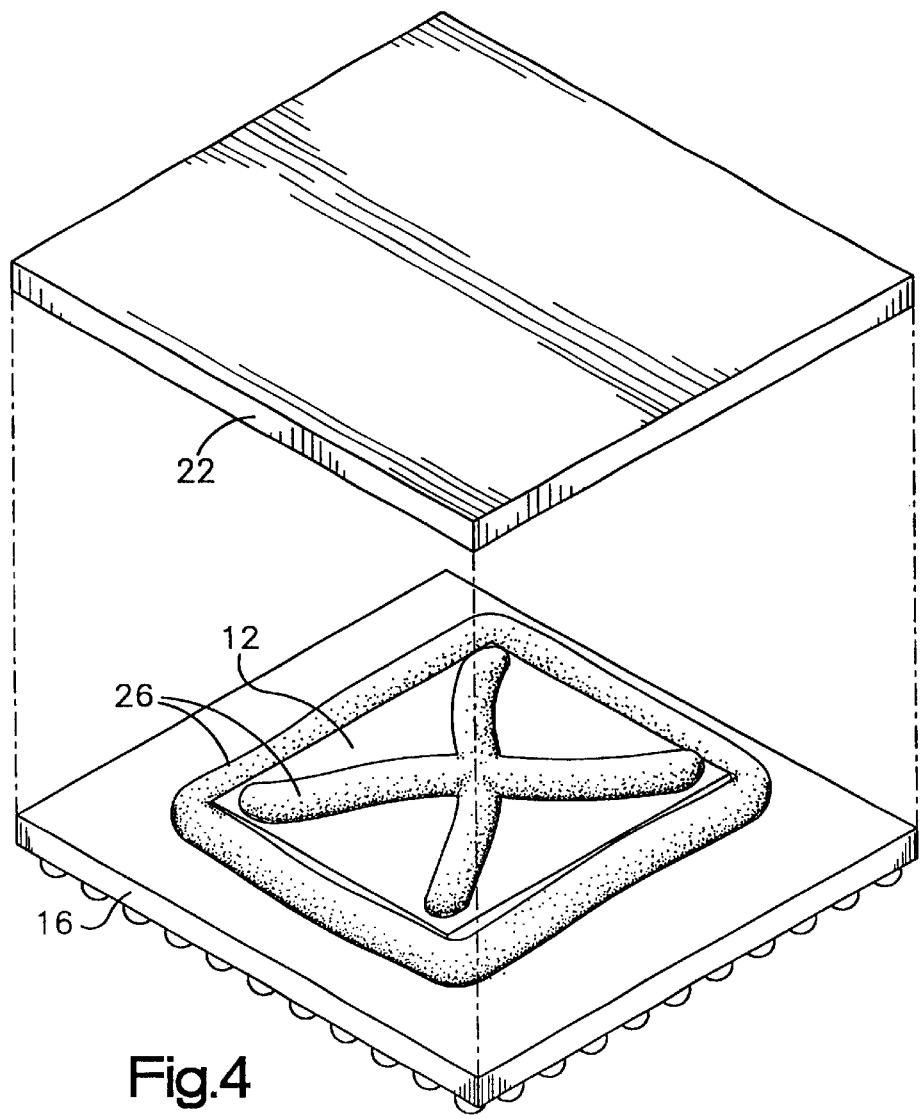
FIG. 4 is a perspective view of one step in the method of making a flip chip package of the present invention, showing the body disposed on the chip prior to contact with the thermally conductive member.

The thermally enhanced flip chip package also comprises body 26. FIG. 4 shows body 26 is preferably applied to upper surface 18 and around periphery 20 of chip 12. Body 26 is preferably applied as an uncured dielectric material, and a suitable material is an epoxy commercially available as Masterbond Supreme 10AOHT from the Masterbond Corporation. Body 26 may be applied in any configuration and preferably a pattern, for example a substantially "X" shaped pattern, that minimizes trapped air when body 26 is subsequently displaced. Body 26 may be applied to chip 12 or to laminate substrate 16 or to thermally conductive member 22 or combinations thereof. Body 26 is preferably applied at a temperature range between about 20° C. to about 28° C.

Underfill material 17 may be uncured or partially uncured before body 26 is applied. If underfill material 17 is cured prior to application of body 26, the surface of underfill material is treated to promote adhesion to body 26. Preferably, underfill material 17 undergoes a surface treatment, and preferably plasma etch, at the surface of the underfill material where it comes into contact with body 26.

Next, thermally conductive member 22 is placed adjacent to surface 18 of chip 12 that is opposite first or active surface 15 of chip 12 such that thermally conductive member 22 is in contact with body 26 that is in contact with chip 12 or laminate substrate 16 or combinations thereof. Preferably force is applied to thermally conductive member 22 and causes uncured body 26 to be extruded or squeezed, thereby substantially filling the space between thermally conductive member 22 and chip 12. Thermally conductive member 22 is preferably placed into contact with body 26 via displacement control to control the distance between thermally conductive member 22 and chip 12. The final spacing between heat conductive member 22 and chip 12 may also be controlled via force control.

After thermally conductive member 22 is contacted with body 26, preferably an uncured dielectric material, the body is cured. The temperature and time for curing vary with the type of material used for the body. For example, Masterbond Supreme 10AOHT epoxy from Masterbond Corporation is preferably cured for about one hour at a temperature of about 130° C. It is preferable that the cure temperature of body 26 is approximately equal to the gel temperature of underfill material 17 to produce a flip chip package that is nearly stress free during cure, however, it is preferable that the underfill material is cured before the body is applied. When body 26 is cured, it is in intimate bonded contact with thermally conductive member 22, flip chip 12, and laminate substrate 16. Body 26 effectively encapsulates flip chip 12.

Thermally conductive member 22 is preferably comprised of stainless steel or any material with good thermal conductivity. More preferably, thermally conductive material 22 is comprised of a 300-Series stainless steel that has a CTE of about 14.4 ppm/° C. and a modulus of about 200 GPa. Beryllium-copper C81300 which has a CTE of about 18 ppm/° C. and a modulus of about 110 Gpa, is an example of another material that may be used for thermally conductive member 22. Thermally conductive member 22 may be comprised of a variety of materials and an exemplary list includes, for example, aluminum, stainless steel, copper, beryllium-copper, ceramic, aluminum silica carbide sintered metal, or combinations thereof.

The method of making a flip chip package provided by the invention herein, comprises selecting the dimensions of thermally conductive member 22 such that the package exhibits minimal warpage throughout the broad temperature range, from about minus 50° C. to about 150° C., that is encountered in manufacture and in use. The appropriate thickness of thermally conductive member 22 can be estimated using the following relation (relation A):

$$E_s \alpha_s / E_h \alpha_h < T_h / T_s < (E_s \alpha_s / E_h \alpha_h)^{1/3}$$

where E, α and T refer to, respectively, the modulus, the CTE and the thickness of the thermally conductive member (denoted by the subscript h) or the laminate substrate (denoted by the subscript s). Where these properties vary over the temperature range of interest, an average value is used.

Given the thickness and material of laminate substrate 16, the range of thickness for thermally conductive member 22 may be determined. For example, when the flip chip package has a laminate substrate comprised of an epoxy glass composite that has an average CTE of about 17 ppm/° C. and a bulk modulus of about 20 GPa, and a thermally conductive member comprised of 304 full-hard stainless steel with the properties described above, the thickness of the thermally conductive member should be made between about 12% and about 49% of the thickness of the laminate substrate to minimize warpage. As another example, if C81300 beryllium-copper is used as the thermally conductive member, its thickness should be between about 17% and about 56% of the thickness of a laminate substrate made of an epoxy glass composite, to minimize warpage.

Finite element analyses have shown that the optimal thickness of thermally conductive member comprised of 304 stainless steel is about 29% of the thickness of the epoxy laminate substrate, and the optimal thickness of a thermally conductive member comprised of C81300 beryllium-copper is about 35% of the thickness of the epoxy laminate substrate described above. These optimal figures can be better estimated using the following empirical relation (relation B):

$$(E_s \alpha_s / E_h \alpha_h)^{1/2} = T_h / T_s$$

where the symbols are the same as stated in relation A above.

Once the proper thickness of thermally conductive member 22 has been determined, the length and width of the thermally conductive member can vary considerably. Preferably, the length or width of the thermally conductive member is at least as large and more preferably at least three characteristic lengths larger than the corresponding width and length of the chip, where the "characteristic length" is defined as the height of the chip. For example, if a flip chip package has a chip that has a height, length and width of about 0.75 mm, about 14 mm and about 10 1mm respectively, the thermally conductive member will preferably have a length of about 16.7 mm and a width of about 12.7 mm, which is at least about three characteristic lengths larger than the corresponding dimensions of the chip.

It is preferable that thermally conductive member 22 be substantially planar, however, many other configurations or profile patterns are possible. For example, a thermally conductive member having peripheral steps, or a thermally conductive member having recesses are possible and the mechanical balancing relationships may be applied. Commonly known averaging techniques may be applied for determining thickness. A thermally conductive member having a configuration that is different than a substantially flat plate can have improved adhesion to the body or the chip or both.

Thermally conductive member 22 is preferably treated to promote adhesion to body 26. When thermally conductive member 22 is comprised of stainless steel, for example, etching may be employed to enrich the chromium content at the surface while removing artifacts present from the steel-rolling process. The enriched chromium surface is preferably coated with a silane coupler, commercially available as Z6040 from Dow Corning Corporation. The silane coupler chemically links thermally conductive substrate 22 to body 26.

While the process described above assumes that body 26 is applied to laminate substrate 16 and chip 12, body 26 may equally well be applied to thermally conductive member 22 or to chip 12 alone.

Figure 5:
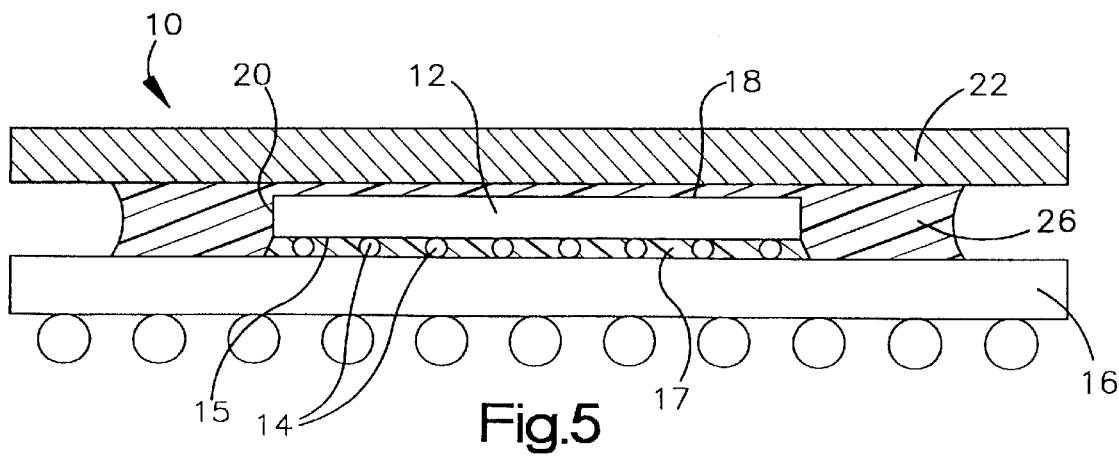
FIG. 5 is a schematic sectional view of a flip chip package of the present invention, showing the width of the conductive member as being greater than the width of the flip chip and approximately equal to the width of the laminate substrate.
Figure 6:
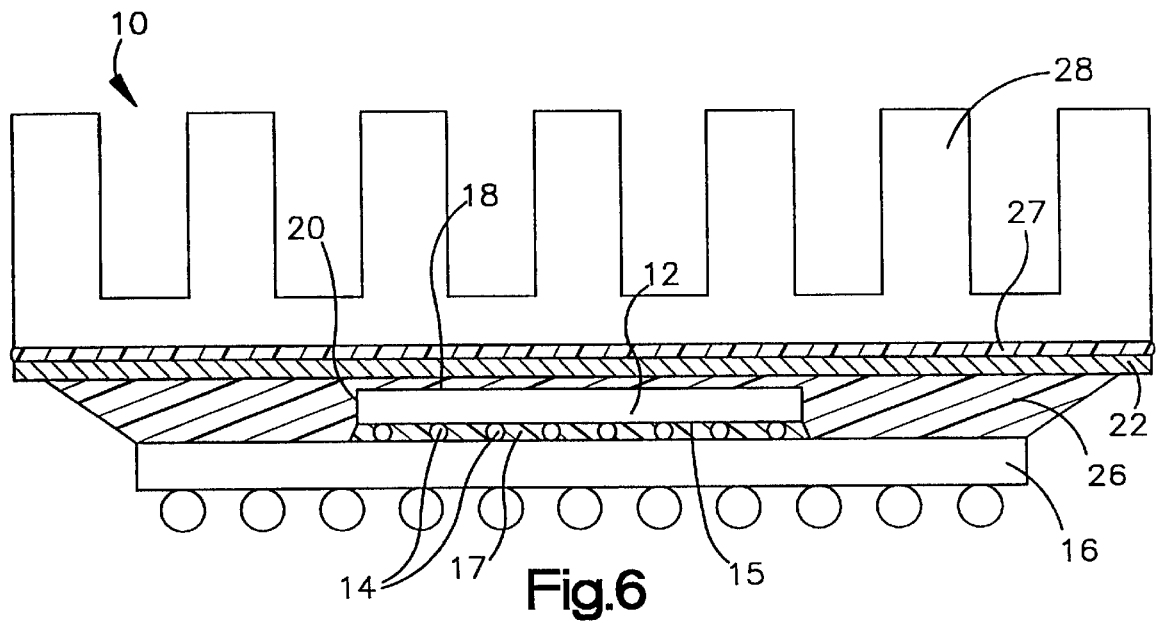
FIG. 6 is a schematic sectional view of a flip chip package of the present invention, showing the width of the conductive member as being greater than the width of the flip chip and also greater than the width of the laminate substrate. Also, the schematic shows a flip chip package with the addition of a heat sink.

The remaining figures illustrate further embodiments of the present invention and incorporate many of the same or similar elements as those described above in reference to device 10. Therefore, like referenced numerals designate identical or corresponding parts throughout the views that follow. FIG. 5 shows the width of a thermally conductive member being greater than the width of the chip 12 and approximately equal to laminate substrate 16, whereas FIG. 6 shows the width of thermally conductive member 22 being greater than the width of chip 12 and laminate substrate 16. FIG. 6 also shows a flip chip package having heat sink 28 for improved heat transfer. Heat sink 28 is bonded to thermally conductive member 22 by thermal coupler 27. It is preferable that thermal coupler 27 is a non-rigid material, for example silicone, so that heat sink 28 is decoupled from the remaining portion of the flip chip package. If heat sink 28 is decoupled from thermally conductive member 22, it will have negligible effect on the thickness of thermally conductive member 22 needed to maintain flatness. If thermal coupler 27 is rigid, the addition of heat sink 28 to the flip chip package may create additional problems in determining the size of thermally conductive member 22 to yield a flip chip package that maintains flatness.

Figure 7:
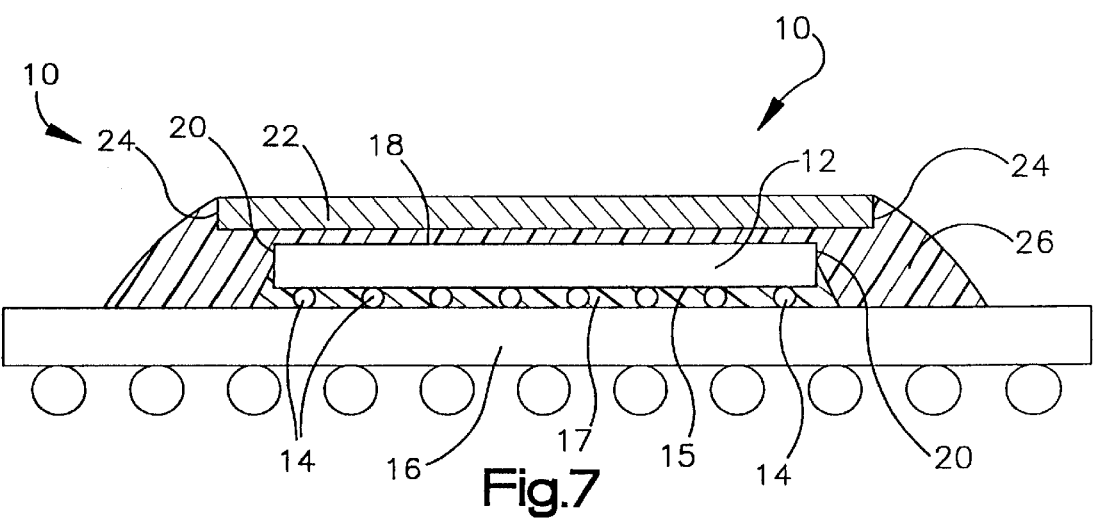
FIG. 7 is a schematic sectional view of a flip chip package of the present invention, showing the body in contact with the periphery of the thermally conductive member.

FIG. 7 is a schematic sectional view of the flip chip package of the present invention in which body 26 is in contact with periphery 24 of thermally conductive member 22 and periphery 20 of chip 12. It is preferred that body 26 is in contact with periphery 24 of thermally conductive member 22 to reduce the likelihood of delamination. Such contact minimizes interfacial stresses normal to the surface of thermally conductive member 22 adjacent to chip 12.

Other modifications and variations of the present invention are possible in light of the above teaching. For example, changes in the sequence in which various components such as laminate substrate, thermally conductive member and chip are provided may be varied without departing from the spirit of the invention. Other aspects, features and advantages of the present invention may be obtained from a study of this disclosure and the drawings. It is to be understood, however, that changes may be made in the particular embodiments described above which are within the full intent and scope of the invention as defined in the appended claims.

What is claimed is:

1. A method of making a flip chip package having a laminate substrate electrically connected to an active surface of chip and having underfill material disposed between the chip and the laminate substrate, the method comprising:

provide a thermally conductive member;

applying a body to said chip or said thermally conductive member or said laminate substrate or combinations thereof; and, placing said thermally conductive member adjacent to surface of said chip that is opposite said active surface of chip;

wherein said body contacts said chip, said laminate substrate and said thermally conductive member and is disposed between said chip and said thermally conductive member.

2. The method of claim 1 wherein said thermally conductive member has a thickness determined according to $E_s\alpha_s/E_h\alpha_h < T_h/T_s < (E_s\alpha_s/E_h\alpha_h)^{1/3}$.

3. The method of claim 1 wherein said thermally conductive member has a thickness determined according to $(E_s\alpha_s/E_h\alpha_h)^{1/2} \equiv T_h/T_s$.

4. The method of claim 1, wherein said thermally conductive member has a length and a width that are at least the size of the corresponding length and width of said chip.

5. The method as set forth in claim 1, wherein the length and width of said thermally conductive member is at least three characteristic lengths greater than the corresponding length and width of said chip.

6. The method as set forth in claim 1 wherein said thermally conductive member is made of material selected from the group consisting of aluminum, copper, ceramic copper-beryllium, stainless steel, a sintered composite of aluminum silica copper, and combinations thereof.

7. The method of claim 1 wherein said thermally conductive member is stainless steel.

8. The method of claim 1, wherein said body is substantially rigid when cured.

9. The method of claim 1 wherein said body is a filled epoxy.

10. The method of claim 1 wherein said flip chip package undergoes deflection of less than about 1 mil in a temperature range between about −50° C. to about 160° C.

11. The flip chip package of claim 10 wherein said thermally conductive member has a thickness determined according to $E_s\alpha_s/E_h\alpha_h < T_h/T_s < (E_s\alpha_s/E_h\alpha_h)^{1/3}$ and a length and width that is at least the size of the corresponding length and width of said chip, and wherein said flip chip package undergoes deflection of less than about 0.5 mil in said temperature range.

12. The method of claim 11 further comprising:

applying a thermal coupler and a heat sink to thermally conductive member.

13. The method of claim 11 wherein said body is applied in a configuration that minimizes air between said chip and said thermally conductive member.

14. The method of claim 13 wherein said configuration is substantially an "X" shaped pattern.

15. The method of claim 1 wherein said thermally conductive member has a profile pattern that improves adhesion to said body or said chip or both.

16. The method of claim 1 further comprising:

treating said thermally conductive member to promote adhesion to said body.

17. The method of claim 16 wherein said treatment comprises etching said thermally conductive member and coating with silane coupler.

18. The method of claim 11 wherein said laminate substrate is comprised of epoxy, said chip is comprised of silicon, and said thermally conductive member is comprised of stainless steel.

* * * * *